Figure 1:
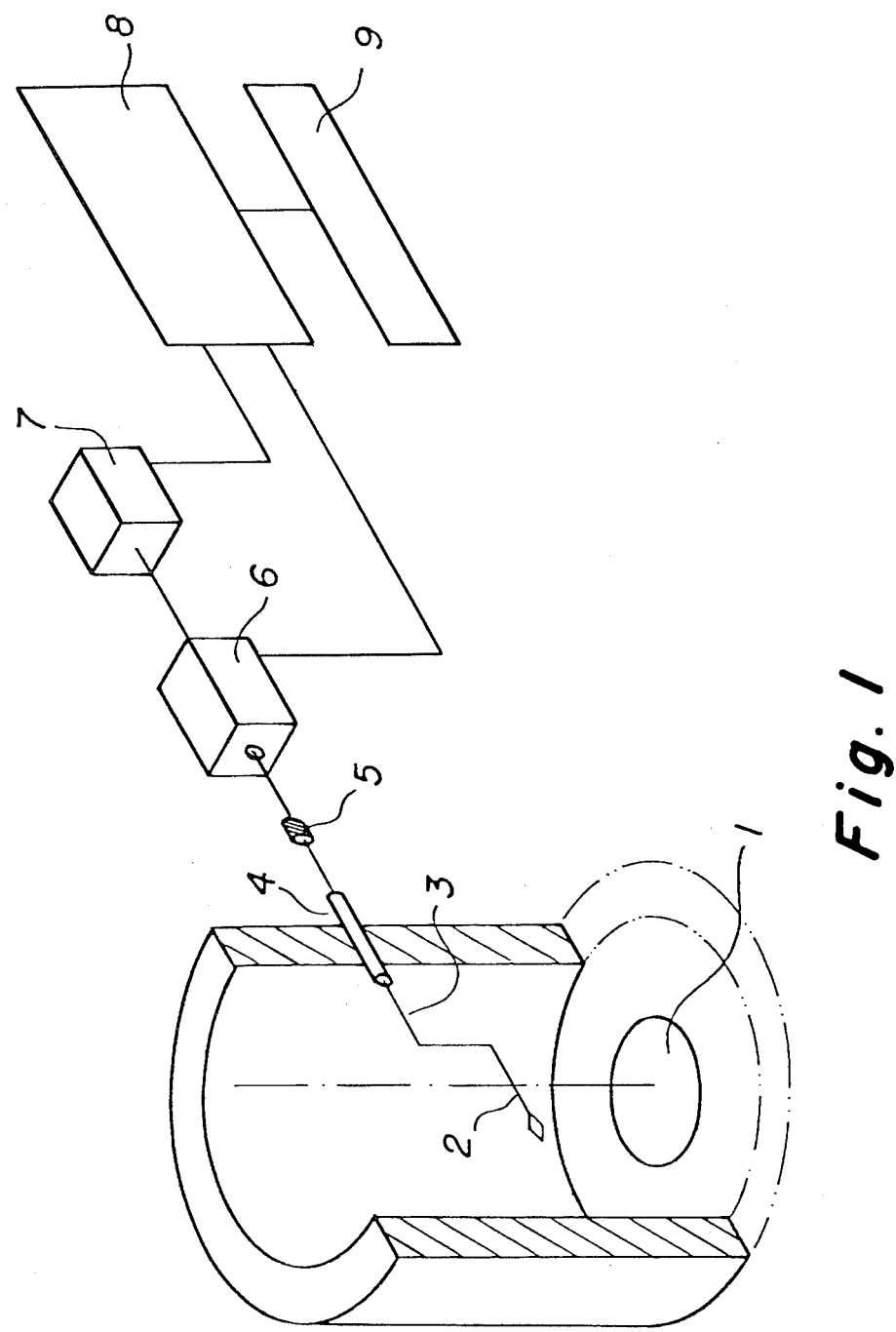

United States Patent [19]

Tenuta de Azevedo

[11] Patent Number: 4,480,188

[45] Date of Patent: Oct. 30, 1984

[54] METHOD AND DEVICE TO DETERMINE INTERPLANAR DISTANCES IN ELECTRON DIFFRACTION IMAGES

[75] Inventor: André L. Tenuta de Azevedo, Ipatinga, Brazil

[73] Assignee: Usinas Siderurgicas De Minas Gerais S.A. -Usiminas, Belo Horizonte, Brazil

[21] Appl. No.: 402,044

[22] Filed: Jul. 26, 1982

[30] Foreign Application Priority Data

Dec. 29, 1981 [BR] Brazil ............................... 8108474

[51] Int. Cl.$^3$ ............................................. G01N 23/00
[52] U.S. Cl. ..................................... 250/306; 250/311
[58] Field of Search ............ 250/306, 307, 311, 505.1; 378/71, 73

[56] References Cited

U.S. PATENT DOCUMENTS 2,619,598 11/1952 Coltman et al. ..................... 250/306
4,316,087 2/1982 Yanaka et al. ...................... 250/311

Primary Examiner—Bruce G. Anderson
Attorney, Agent, or Firm—Emory L. Groff, Jr.

[57] ABSTRACT

The invention relates to a method and device that make it possible to determine interplanar distances in electron diffraction images in electron microscopes. This is done through its beam stopper, which originally was used only to interrupt the central beam for better display of the diffraction image.

The invention makes possible the elimination of errors normally committed in determining said distances, many of them related to the deformation of the film and to unsuitably exposed photographs.

1 Claim, 5 Drawing Figures

METHOD AND DEVICE TO DETERMINE INTERPLANAR DISTANCES IN ELECTRON DIFFRACTION IMAGES

This invention relates to a method and device that make it possible to determine interplanar distances in electron diffraction images in transmission electron microscopes through use of its beam stopper, an accessory common to this type of microscope or even another similar accessory developed especially for this purpose. Said beam stopper originally was used only to interrupt the central beam for better display of the diffraction image, or also to indicate a more important detail of the image observed.

Electron diffraction images are extremely important in working with thin slides and extraction replicas in transmission electron microscopes. Their correct analysis makes it possible to determine the interplanar distances of diffracting phases, to identify them and to determine possible relations of crystallographic orientation.

Determination of interplanar distances in spotty diffraction images is generally a simple but drawn-out task because of involvement in outside steps such as photography, development, copying and analysis.

Analysis consists of measuring the distances from points of interest of the diffraction image to the point corresponding to the undiffracted central beam. Measurement is also taken of the angles between the directions that contain various parts of diffraction to check the various possible angular relations.

Many errors are committed that can be associated with deformation of the film and the very measurement of the distances since work, generally with the naked eye, is involved with photographs that are not always suitably exposed.

The method and device to determine interplanar distances in electron diffraction images were developed to eliminate the drawbacks cited above and, in addition, to establish a diagram of in situ analysis with the possibility of redirecting the work with the microscope particularly in a continuous manner without drawn-out interruptions to develop the photographs.

Sheets 1, 2, 3 and 4 of the accompanying drawings show the device of the invention and the method used.

Sheet 1, FIG. 1, shows the beam stopper, of the type normally used in a transmission electron microscope, along with the device that has been developed, showing:
1—Fluorescent screen
2—Beam stopper tip
3—Rod
4—O ring
5—Knob
6—Translation meter
7—Rotation angle meter
8—Microprocessor
9—Display and/or printer.

Items (2), (3), (4) and (5) are normally parts of the beam stopper. Items (6), (7), (8) and (9) constitute the device of the invention. In the normal operation of a transmission electron microscope, knob (5) is manipulated to make beam stopper tip (2) produce a shadow on the part of the image of interest that is seen on the fluorescent screen (1). The translation and rotation movements of knob (5) are transmitted by rod (3) to beam stopper tip (2) through O ring (4), whose function is to seal the vacuum on the inside of the microscope column. By the combination of the translation and rotation movements, the shadow of beam stopper tip (2) can be positioned on any point of the image fluorescent screen (1). Translation meter (6), mechanical or electronic, is coupled to an extension of rod (3) and provides precise readings of its lengthwise positioning. Rotation angle meter (7), also mechanical or electronic, is coupled to the same front extension and provides reading of the angular positioning of rod (3). In case meters (6) and (7) are electrical-electronic, their signals are continuously processed by microprocessor (8) which has in its program all the corrections necessary to go from these signals directly to the crystallographic results of interest. Access to these results is performed by display and/or printer (9).

Sheets 2, 3, 4 and 5 of the accompanying drawings show the theoretical development of the method.

Figure 2:
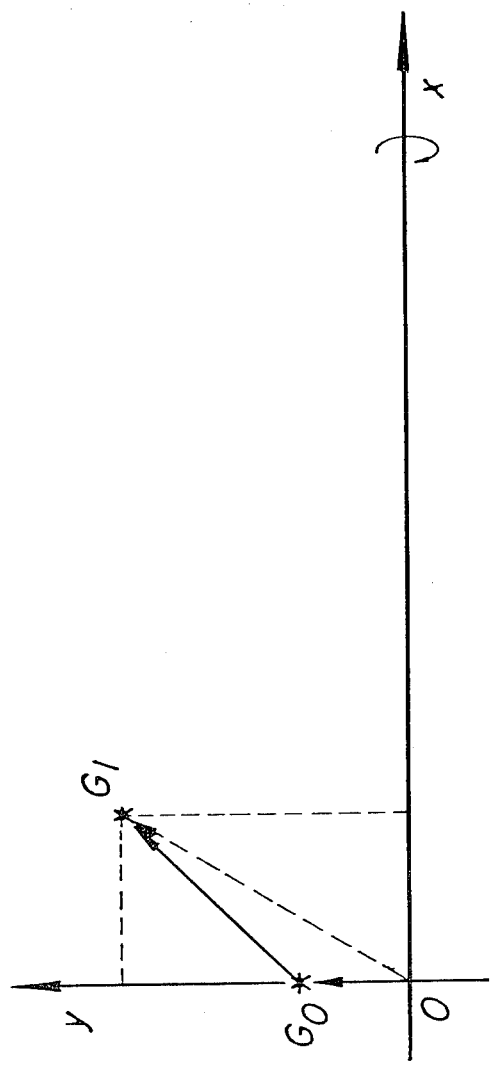

Sheet 2, FIG. 2, represents a system of coordinates where x is the lengthwise direction of the beam stopper, which, as already said, can undergo a rotation on its axis, which causes a shift of its shadow, projected on the fluorescent screen, perpendicular to x. Let $G_0$ and $G_1$ be points on the diffraction image to be analyzed, with $G_0$ corresponding to the central beam and $G_1$ to the diffracted beam whose vector $g_1$ is to be determined completely. Thus, an xy coordinate system is defined, with y defined by the perpendicular direction of the movement of the shadow of the beam stopper tip, during its rotation, which goes through central beam $G_0$. The more general case is considered to be the one in which the beam stopper, being in its lowest rotation position, its shadow does not go through $G_0$, as is the case in FIG. 2. This implies in the appearance of vector $\vec{G}_0$, the position of the central beam and in the following vectoral relation:

$$\vec{g_1} = \vec{G_1} - \vec{G_0} \tag{1}$$

where only $\vec{G}_0$ has a component along y, i.e., $$\vec{G_0} = |G_0 y|\vec{y} \tag{2}$$

and $\vec{G}_1$ can be broken down into $$\vec{G_1} = |G_1 x|\vec{x} + |G_1 y|\vec{y} \tag{3}$$

The next step is to tell how the various components along x and y can be measured to allow calculation of $\vec{g_1}$. Initially, the components along x are measured on the outside of the microscope by the coupled translation meter, by simple subtraction of its readings. Thus, $$|G_1 x| = S_0 - S_1 \tag{4}$$

where $S_0$ and $S_1$ are readings x corresponding to the positioning of the beam stopper tip successively at points $G_0$ and $G_1$.

Figure 3:
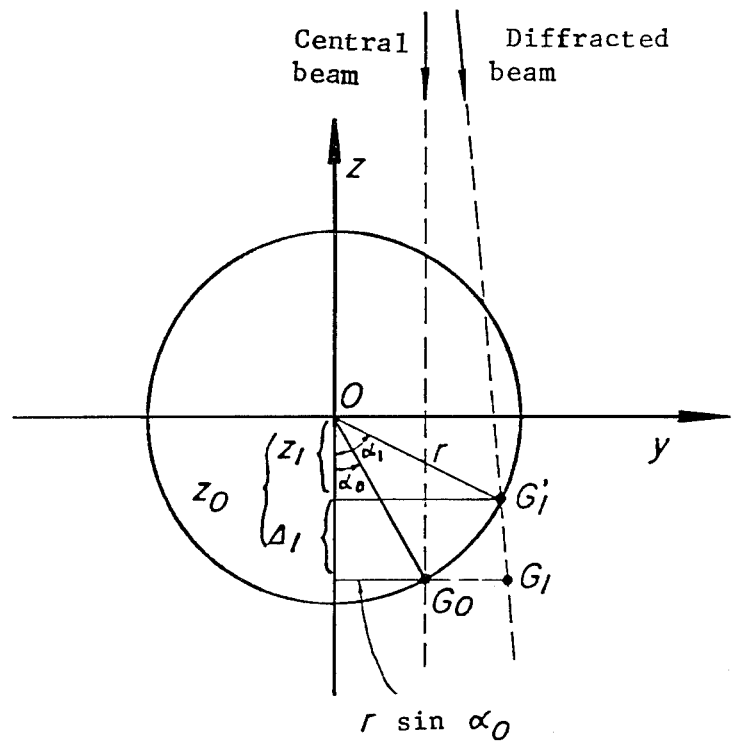

To determine the components along y, it is necessary to have the value of rotation $\alpha$ of the beam stopper for positioning of its tip as points $G_0$ and $G_1$. Thus, sheet 3, FIG. 3, shows a diagram of intersection of the beams transmitted and diffracted at different levels, the xy coordinate system again being shown but from direction x. Direction Z, perpendicular to plane x0y, is parallel to the direction of the central beam. The circle corresponds to rotation of the beam stopper and has a fixed radius r. In accordance with the geometry show, we $$|G_0Y| = r \sin \alpha_0 \qquad (5)$$

But it can be seen that the beam stopper does not succeed in intercepting diffracted beam $G_1$ at the same level of intersection with central beam $G_0$, this occurring only at another level distant $\Delta_1$ from the first, at point $G_1$. This implies that the apparent component along y of vector $\vec{G}_1$ is different from the real component of vector $\vec{G}_1$ by a determined value $\delta_1$.

Figure 4:
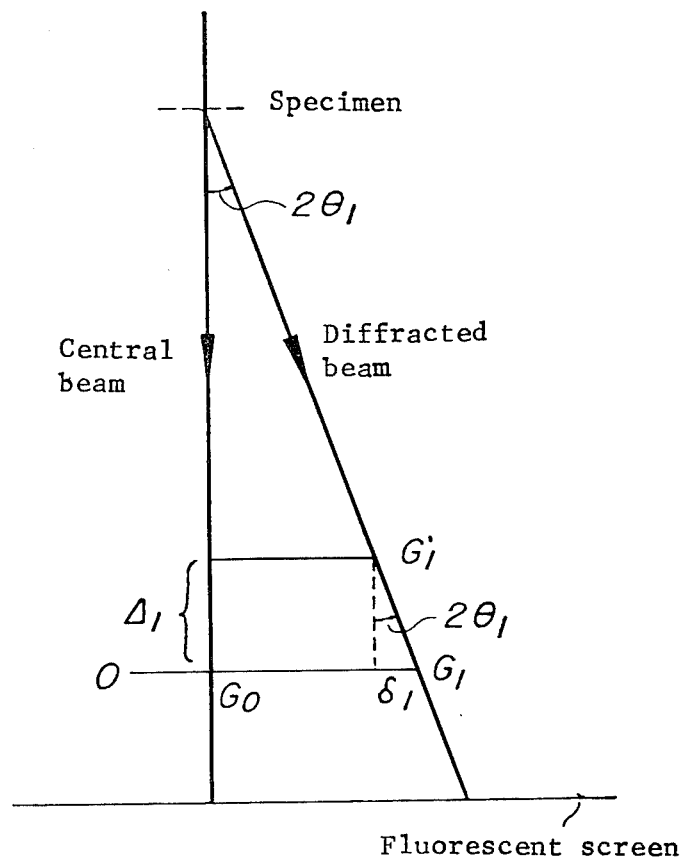

Sheet 4, FIG. 4, shows a detail of FIG. 2, which makes it possible to determine said value $\delta_1$. In the figure it can be seen that $$\Delta_1 = Z_0 - Z_1 = r(\cos\alpha_0 - \cos\alpha_1)$$

and, $$\tan 2\theta_1 = \frac{\delta_1}{\Delta_1} \quad e \quad \delta_1 = \Delta_1 \tan 2\theta_1$$

from which we get, $$\delta_1 = r(\cos\alpha_0 - \cos\alpha_1)\tan 2\theta_1 \qquad (6)$$

where $\theta_1$ is the Bragg diffraction angle corresponding to vector $\vec{g}_1$.

Thus applying correction $\delta_1$, we have $$|G_{1y}| = |G_{1y}'| + \delta_1 \qquad (7)$$

$$|G_{1y}| = r\sin\alpha_1 + r(\cos\alpha_0 - \cos\alpha_1)\cdot\tan 2\theta_1 \qquad (8)$$

and also since measurement of $G_1$ along x is made at the same high level, equation (4) should be modified to $$|G_{1x}| = S_0 - S_1 + \delta_1 \qquad (9)$$

$$|G_{1x}| = S_0 - S_1 + r(\cos\alpha_0 - \cos\alpha_1)\cdot\tan 2\theta_1 \qquad (10)$$

In this way, by using equations (2) to (10), we can rewrite equation (1) as follows:

$$\vec{g}_1 = |G_{1x}|\vec{x} + [|G_{1y}| - |G_{0y}|]\vec{y}$$

$$\vec{g}_1 = [S_0 - S_1 + r(\cos\alpha_0 - \cos\alpha_1)\tan 2\theta_1]\vec{x} + r[(\sin\alpha_1 - \sin\alpha_0) + (\cos\alpha_0 - \cos\alpha_1)\cdot\tan 2\theta_1]\vec{y} \qquad (11)$$

where $$\vec{g}_1 = a\vec{x} + b\vec{y}.$$

With the modulus of $\vec{g}_1$ being calculated by $\sqrt{a^2 + b^2}$ and angle $\beta$ with direction x being given by $\beta = b/a$.

It is noted that the values that enter into equation (11) were measured from the positions of the beam stopper, with the exception of Bragg angle $\theta_1$ which for the general case is not assumed to be known. However, according to the equation of the constant of the microscope chamber, we have $$|g_1|d_1 = \lambda L \qquad (12)$$

and the Bragg law can be rewritten:

$$\lambda L = 2Ld_1 \sin\theta_1 \qquad (13)$$

$$|g_1|d_1 = 2Ld_1 \sin\theta_1$$

where, $$\sin\theta_1 = \frac{|g_1|}{2L}$$

so $$\tan\theta_1 = \frac{|g_1|/2L}{\sqrt{1 - (|g_1|/2L)^2}}$$

But for small values of $\theta_1$, like those involved here, it can be considered $$\tan 2\theta_1 = \frac{|g_1|/L}{\sqrt{1 - (|g_1|/2L)^2}} \qquad (14)$$

However, it is still not possible to calculate $\vec{g}_1$ through (11), since the modulus of $\vec{g}_1$ enters into the expression of $\tan 2\theta_1$. In this case, the iterative method of calculation is resorted to, which begins by disregarding in (11) the terms containing $\theta_1$, in the simplified equation $|\vec{g}_1|$ being calculated, by $\tan 2\theta_1$ being calculated in accordance with (14) and by resuming equation (11), which this time is complete.

Figure 5:
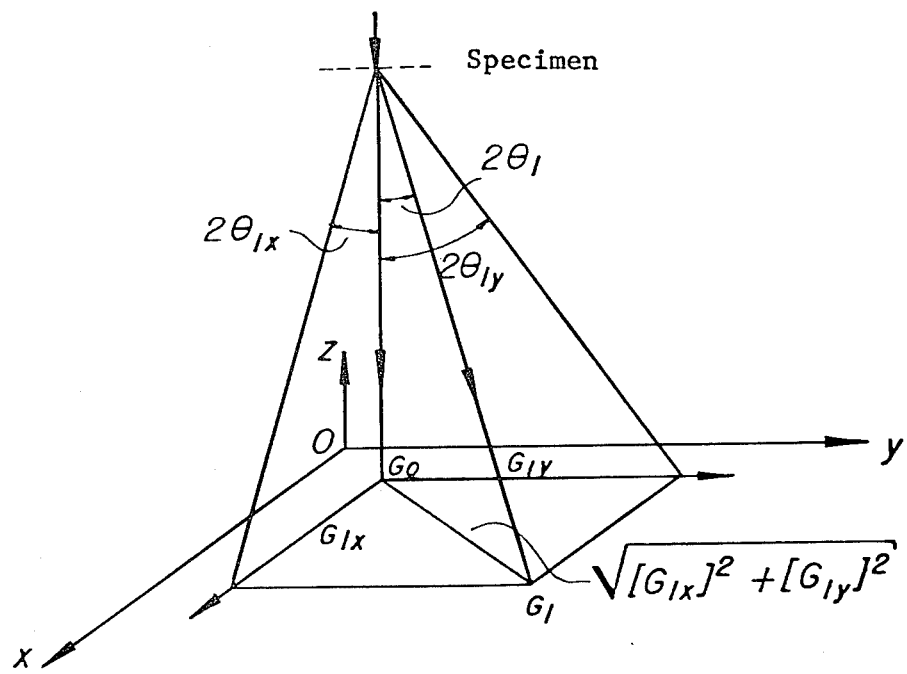

However, Bragg angle $2\theta_1$ when looked at as shown on sheet 4, FIG. 4, is not the true magnitude and should be considered as an angle $2\theta_{1y}$, whose value can be estimated. For this, sheet 5, FIG. 5, shows the projection of angle $2\theta_1$ along planes $x0_z$ and $y0_z$. There $$\tan 2\theta_1 = \frac{\sqrt{|G_1X|^2 + |G_1Y|^2}}{L} \qquad (15)$$

$$\tan 2\theta_1 Y = \frac{G_1Y}{L}$$

$$\tan 2\theta_1 Y = \frac{G_1Y \cdot \tan 2\theta_1}{\sqrt{|G_1X|^2 + |G_1Y|^2}}$$

By analogy, $$\tan 2\theta_1 X = \frac{G_1X \cdot \tan 2\theta_1}{\sqrt{|G_1X|^2 + |G_1Y|^2}} \qquad (16)$$

Therefore, it is noted that $\tan 2\theta_1$ and $\tan 2\theta_1 Y$ are always less than $\tan 2\theta_1$, this implying that the corrections that involve $2\theta_1$ are of less importance in relation to the other terms. In any case, the correct expression for $\vec{g}_1$ becomes:

$$\vec{g}_1 = [S_0 - S_1 + r(\cos\alpha_0 - \cos\alpha_1)\tan 2\theta_1 X]\vec{x} + r[(\sin\alpha_1 - \sin\alpha_0) + (\cos\alpha_0 - \cos\alpha_1)\cdot\tan 2\theta_1 Y]\vec{y}$$

from which we get $$\vec{g}_1 = \left[ S_0 - S_1 + r(\cos\alpha_0 - \cos\alpha_1) \cdot \right. \qquad (17)$$

$$\left. \frac{|G_1X| \cdot \tan 2\theta_1}{\sqrt{|G_1X|^2 + |G_1Y|^2}} \right] \vec{x} +$$

$$r \left[ (\sin\alpha_1 - \sin\alpha_0) + (\cos\alpha_0 - \cos\alpha_1) \cdot \right.$$

-continued $$\left. \frac{|G_{1y}| \cdot \tan 2\theta_1}{\sqrt{|G_1X|^2 + |G_1Y|^2}} \right] \vec{y}$$

Solution of the system (14) and (17) can, of course, be achieved only by the iterative method described above.

For practical use of the method and device to determine interplanar distances in electron diffraction images, the procedure is as follows:

the beam stopper is adjusted on each of the diffraction points of interest and the corresponding readings of the meters of translation and rotation angle of the beam stopper are taken;

correct positioning of the beam stopper can normally be made with a binocular magnifying glass generally coupled to transmission electron microscopes;

these observations can be made with the fluorescent screen duly tilted, without prejudice to the geometric processing described above;

the necessary calculations are made from the data obtained.

If the device includes electrical-electronic translation and rotation angle meters, whose signals are processed directly by a microprocessor, the correction calculations cannot be adopted completely (equation 17).

If the device includes mechanical or electrical-electronic translation and rotation angle meters, but without computation, the present method can be used in a simplified manner, incurring errors on the order of 0.5%. To do this, the terms in tan $2\theta_1$ in equation (17) are disregarded, which is reduced to $$\vec{g}_1 = (S_0 - S_1)\vec{x} + r(\sin\alpha_1 - \sin\alpha_0)\vec{y} \qquad (18).$$

It is also noted that with the aid of the alignment lens of the projecting lens it is possible to shift the complete diffraction image to practically any area of the screen, even to make the central beam coincide with the beam stopper when it is at its lower rotation point, i.e., to make vector $G_0$ of FIG. 2 equal to zero. Vector $\vec{g}_1$ simply becomes $$\vec{g}_1 = (S_0 - S_1)\vec{x} + r\sin\alpha_1 \vec{y} \qquad (19).$$

In regard to units, we note that $(S_0 - S_1)$ and $r \sin \alpha_1$ have units in mm while $g_1$ has a unit of $\text{Å}^{-1}$ because it is a reciprocal network vector. Therefore, unit $\vec{x}$ and $\vec{y}$ should have units $\text{Å}^{-1}/\text{mm}$, since their moduli $|x|$ and $|y|$ will be found from a calibration by using a pattern that provides ring diffraction made with the beam stopper. In this calibration, it is necessary to move the beam stopper only along x and the modulus, or constant, found will able be valid for $|y|$.

Use of said method and device offers the following advantages:

elimination of the steps of photography, development and copying, all consuming material and time;

elimination of sources of error in each of these photograph steps which could be incorrect exposure of the film, distortions and damage to the film;

elimination of drawn-out interruptions of the work with the microscope to perform the photography steps;

great speed in obtaining results, either by use of a microprocessor or by use of a simplified correction (equation 19) with calculations performed manually;

simplification of the process of analyzing the diffraction images;

greater accuracy in the results obtained.

I claim:

1. Means for determining interplanar distances in electron diffraction images to be used in a transmission electron microscope, comprising a beam stopper including a rod, said rod having a tip, means on said rod for moving it linearly and rotationally, said rod including an extension, an electronic translation meter connected to said rod extension, an electronic rotation angle meter also connected to said rod extension, a microprocessor connected to each of said meters to continuously process signals therefrom whereby it is possible to determine the interplanar distance and angular relations of electron diffraction by positioning the shadow of said beam stopper rod tip on each of the points of interest of the diffraction and the values provided by the meters being used with correction equations.

* * * * *